(12) United States Patent
Morino et al.

(10) Patent No.: US 8,583,999 B2
(45) Date of Patent: Nov. 12, 2013

(54) DISPLAY CONTROL APPARATUS

(75) Inventors: Harumi Morino, Kanagawa (JP);
Tatsuo Nakai, Kanagawa (JP); Junkei Sato, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 135 days.

(21) Appl. No.: 13/197,745

(22) Filed: Aug. 3, 2011

(65) Prior Publication Data

US 2012/0036418 A1    Feb. 9, 2012

(30) Foreign Application Priority Data

Aug. 4, 2010    (JP) ................................. 2010-175507

(51) Int. Cl.
*G06F 11/00*    (2006.01)

(52) U.S. Cl.
USPC ............................ 714/807; 714/749; 714/758

(58) Field of Classification Search
USPC ......... 714/807, 749, 763, 758, 799, 735, 748, 714/25; 345/174, 156, 180
See application file for complete search history.

(56) References Cited

U.S. PATENT DOCUMENTS

| | | | | |
|---|---|---|---|---|
| 4,054,949 A | * | 10/1977 | Takezoe | 709/234 |
| 4,429,368 A | * | 1/1984 | Kurii | 714/38.12 |
| 4,698,785 A | * | 10/1987 | Desmond et al. | 714/38.1 |
| 5,508,909 A | * | 4/1996 | Maxwell et al. | 700/18 |
| 5,657,005 A | * | 8/1997 | Seebeck et al. | 340/12.15 |
| 5,748,873 A | * | 5/1998 | Ohguro et al. | 714/11 |
| 5,905,489 A | * | 5/1999 | Takahama et al. | 345/174 |
| 6,112,324 A | * | 8/2000 | Howe et al. | 714/763 |
| 7,702,703 B2 | | 4/2010 | Sano et al. | |

FOREIGN PATENT DOCUMENTS

| | | |
|---|---|---|
| JP | 2007-72394 A | 3/2007 |
| JP | 2007-101691 A | 4/2007 |

* cited by examiner

*Primary Examiner* — Fritz Alphonse
(74) *Attorney, Agent, or Firm* — Miles & Stockbridge P.C.

(57) ABSTRACT

A display control apparatus includes a comparison control unit which performs a cyclic redundancy check over an arbitrary region of image data. The comparison control unit includes a region control unit which selects a region of the image data based on comparison region information for specifying an arbitrary region of the image displayed on the display unit as a cyclic redundancy check target region, an arithmetic processing unit which performs arithmetic processing for the cyclic redundancy check over a region selected by the region control unit, and a comparison circuit which performs error detection by comparing the result of the arithmetic processing by the arithmetic processing unit with its expected value. Error detection by the cyclic redundancy check is performed only on the target region of the cyclic redundancy check in the arbitrary region, which facilitates the cyclic redundancy check.

17 Claims, 16 Drawing Sheets

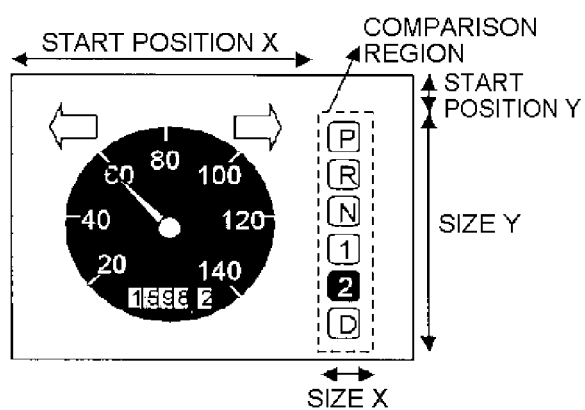
FIG. 4A EXAMPLE OF OVERLAID IMAGE REGION SETTING
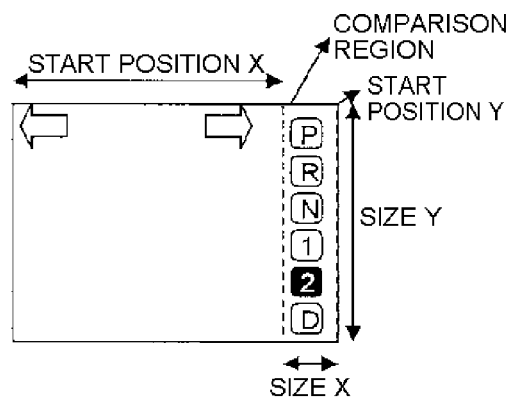
FIG. 4B EXAMPLE OF PLANE COMPARISON REGION SETTING

DISPLAY CONTROL APPARATUS

CROSS-REFERENCE TO RELATED APPLICATION

The disclosure of Japanese Patent Application No. 2010-175507 filed on Aug. 4, 2010 including the specification, drawings and abstract is incorporated herein by reference in its entirety.

BACKGROUND

The present invention relates to an image display control technology, and particularly to a technology which can be effectively applied to control display of an instrument panel on a dashboard of an automobile, for example.

When performing wired or wireless data transmission, Cyclic Redundancy Check (CRC) is known as a technique to detect transmission errors. Being a type of function that receives a data stream of any length and outputs a fixed-size value such as a 32-bit integer, CRC is regarded as a type of error detection codes for detecting successive errors.

Patent literature 1 (Japanese Patent Laid-Open No. 2007-101691) describes a technique for determining whether a signal output from a device under test is satisfactory or defective. According to literature 1, a determination apparatus comprises a display signal input interface, an LVDS-Parallel converter, and a Parallel-LVDS converter. The determination apparatus further comprises a CRC arithmetic circuit, a counter circuit, an expected value storage unit, and a determination circuit formed by FPGA. The CRC arithmetic circuit performs arithmetic on an image signal, and the determination circuit compares the result of calculation by the CRC arithmetic circuit with an expected value stored in the expected value storage unit and determines whether the image signal is satisfactory or defective.

Patent literature 2 (Japanese Patent Laid-Open No. 2007-072394) describes a technique for easily performing an error check on data stored in a frame memory. According to literature 2, a screen display control apparatus comprises a frame memory which stores image data corresponding to a single screen to be displayed on the screen display unit, a controller which periodically reads image data corresponding to a single screen from the frame memory to display an image of the single screen on the screen display unit, and an error detection unit which performs an error detection process to check whether an error exists in the image data for the single screen that is read out by the controller.

SUMMARY

An instrument panel is installed on the dashboard of an automobile. The term instrument panel refers to a gauge panel having a speedometer or a warning light attached thereto. In recent years, graphic display instrument panels are gradually increasing. Graphic display instrument panels require a function of checking whether or not data display is normal in order to comply with ISO 26262, i.e., the international standard for functional safety of vehicle-mounted instruments. The inventors of the present application have examined such functions and found the following problems.

Error detection may be performed by a CRC described in patent literature 1 and 2, for example. However, performing error detection by the CRC all over the entire instrument panel is unrealistic due to the enormous amount of data taking the true value. The range and position of data comparison is preliminarily decided by the CRC and cannot be freely changed. Furthermore, although the display data on the instrument panel is generated by combining several planes, it is difficult to preliminarily calculate an expected value for the final display data when performing comparison by the CRC.

The present invention has been made in view of the above circumstances and provides a technique for a graphic display instrument panel to appropriately check whether or not data display is normal.

The other purposes and the new feature of the present invention will become clear from the description of the present specification and the accompanying drawings.

The following explains briefly the outline of a typical invention among the inventions disclosed in the present application.

A display control apparatus (display control device) comprises a display output control unit for performing display control of image data on a display unit, and a CPU which can control the operation of the display output control unit. The display output control unit includes a comparison control unit which performs a cyclic redundancy check over an arbitrary region of the image data displayed on the display unit. The comparison control unit includes a region control unit which selects a region of the image data based on comparison region information for specifying an arbitrary region of the image displayed on the display unit as a cyclic redundancy check target region, an arithmetic processing unit which performs arithmetic processing for a cyclic redundancy check over a region selected by the region control unit, and a comparison circuit which performs error detection by comparing the result of the arithmetic processing by the arithmetic processing unit with its expected value.

The following explains briefly the effect acquired by the typical invention among the inventions disclosed in the present application.

A technique is provided for a graphic display instrument panel to appropriately check whether or not data display is normal.

BRIEF DESCRIPTION OF THE DRAWINGS

FIG. 4 is an explanatory diagram of comparison region setting;

DETAILED DESCRIPTION

1. Outline of Embodiments

Figure 1:
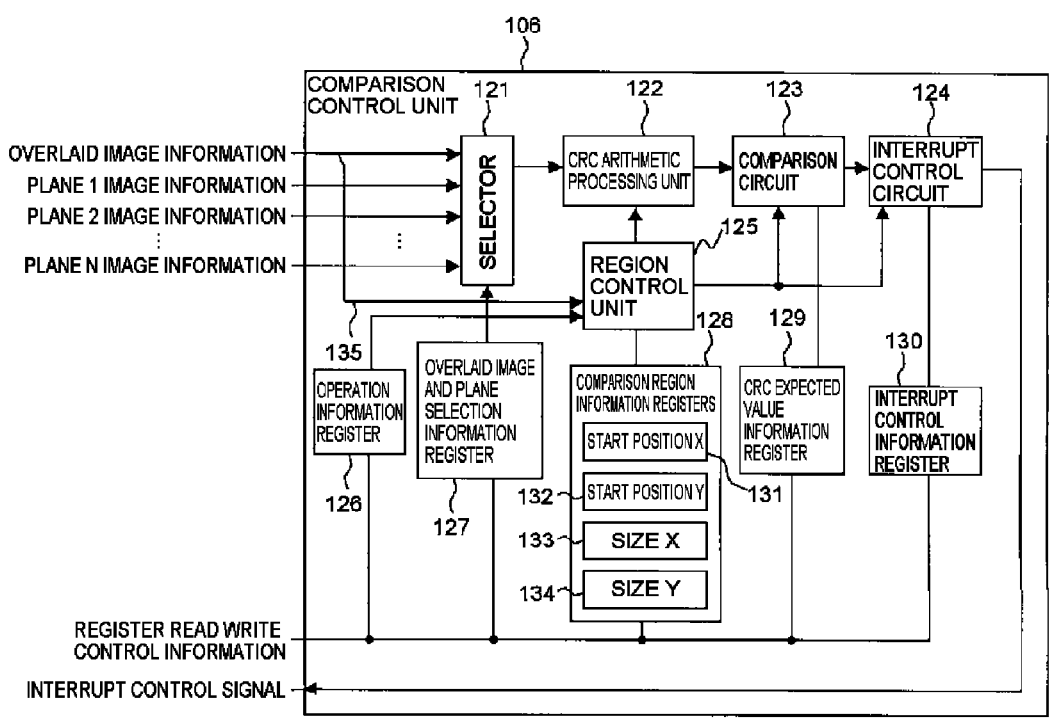
FIG. 1 is a block diagram illustrating an exemplary configuration of a comparison control unit of a display control apparatus according to the present invention.

First, a representative embodiment of the invention disclosed in this application will be described.

Reference numerals of the drawings parenthesized in the outline description of the representative embodiments only exemplify instances included in the concept of the components referred to thereby.

[1] A display control apparatus (1) according to a representative embodiment of the present invention includes a display output control unit (100) for performing display control of image data on a display unit, and a CPU (10) which can control the operation of the display output control unit.

The display output control unit (100) includes a comparison control unit (106) which performs a cyclic redundancy check over an arbitrary region of the image data displayed on the display unit. The comparison control unit includes a region control unit (125) which selects a region of the image data based on comparison region information for specifying an arbitrary region of the image displayed on the display unit as a cyclic redundancy check target region, an arithmetic processing unit (122) which performs arithmetic processing for the cyclic redundancy check over a region selected by the region control unit, and a comparison circuit (123) which performs error detection by comparing the result of the arithmetic processing by the arithmetic processing unit with its expected value.

According to the above configuration, arithmetic processing for cyclic redundancy check is performed over the selected region by selecting a region of the image data based on the comparison region information for specifying an arbitrary region of the image displayed on the display unit as a target region of the cyclic redundancy check. Error detection by the cyclic redundancy check is performed only on the target region of the cyclic redundancy check, and thus it suffices to prepare as many expected values of the arithmetic processing result for the cyclic redundancy check as the number of states of the cyclic redundancy check target region (comparison region). It thus prevents the amount of data of the expected value from being overwhelming, and whereby the cyclic redundancy check can be easily implemented. Accordingly, a graphic display instrument panel can appropriately check whether or not data display is normal.

[2] In article [1], the display output control unit further comprises a plurality of plane control units (108-1, 108-2 . . . and 108-n) for receiving different image data respectively, and an overlay control unit (105) which forms image data to be displayed by overlaying the image data received by the plane control unit. In addition, the comparison control unit further comprises a selector (121), which can supply output image information of the plane control unit or output image information of the overlay control unit selectively to the arithmetic processing unit. Accordingly, the output image information of the plane control unit or the output image information of the overlay control unit can be selectively supplied to the arithmetic processing unit.

[3] In article [2], a plurality of the comparison control units can be provided, the comparison control units performing, in parallel, the cyclic redundancy check over an arbitrary region of the image data respectively displayed on the display unit. Accordingly, the cyclic redundancy check on a plurality of regions can be immediately performed.

[4] In article [2], the comparison control unit can display an error message on the display unit based on the result of the comparison by the comparison circuit, and turns on a warning light (31) provided near the display unit. For example, a user can know that the current display on the display unit is not correct by the warning light being turned on even if no error message is displayed on the display unit due to some error.

[5] In article [2], a selection information register (127) which holds control information of the selector, a selection update information register (137) which holds update information of the control information in the selection information register, a comparison region information register (128) which holds the comparison region information, and a comparison region update information register (138) which holds update information of the comparison region information in the comparison region information register can be provided. Additionally, in article [4], an expected value information register (129) which holds an expected value of the results of the arithmetic processing by the arithmetic processing unit, and an expected value update information register (139) which holds update information of the expected value in the expected value information register can be provided. The information held in the selection information register is updated by the information held in the selection update information register in synchronization with a vertical synchronizing signal of the display unit, and the information held in the comparison region information registers is updated by the information held in the comparison region update information register in synchronization with a vertical synchronizing signal of the display unit. The information held in the expected value information register is updated by the information held in the expected value update information register in synchronization with a vertical synchronizing signal of the display unit.

[6] In article [2], the comparison control unit can be equipped with an interrupt control circuit (124) which forms an interrupt control signal for requesting an interrupt to the CPU based on the result of the comparison by the comparison circuit. The interrupt control circuit can be equipped with a counter (181) for counting the number of erroneous frames based on the result of the comparison by the comparison circuit, and a comparator (182) for comparing the value counted by the counter with a predetermined threshold. Based on the result of the comparison by the comparator, the interrupt control signal is asserted.

[7] In article [2], the comparison control unit can be equipped with an interrupt control circuit (124) which forms an interrupt control signal for requesting an interrupt to the CPU based on the result of the comparison by the comparison circuit. The interrupt control circuit can be easily configured to include a plurality of counters (181a, 181b and 181c) for counting the number of erroneous frames based on the result of the comparison by the comparison circuit, a counter selection control unit (186) for selecting the counters, and a comparator (182) for comparing the value counted by the counter selected by the counter selection control unit with a predetermined threshold. Based on the result of the comparison by the comparator, the interrupt control signal is asserted.

[8] In article [2], the display control apparatus can be equipped with a first buffer (111) for externally outputting the image data output from the display output control unit, and a second buffer (112) for receiving the image data externally output via the first buffer into the display control apparatus again. The display output control unit can be easily configured to include a selector (113) for transmitting the output of the first buffer and the output of the second buffer selectively to the comparison control unit.

[9] Another display control apparatus (1) according to a representative embodiment of the present invention includes a display output control unit (100) for performing display control of image data on a display unit, a CPU (10) which can control the operation of the display output control unit, a first buffer (111) for externally outputting the image data output from the display output control unit, and a second buffer (112) for receiving the image data externally output via the first buffer into the display control apparatus again. The display output control unit includes a loop-back comparison control unit (118) which performs error detection over an arbitrary region of the image displayed on the display unit, and a selector (117) which transmits the output of the first buffer and the output of the second buffer selectively to the loop-back comparison control unit. The loop-back comparison control unit includes a region control unit (155) which selects a region of the image data based on region update information for specifying an arbitrary region of the image displayed on the display unit as a region to be checked, and a bit comparison processing unit (151) which performs error detection by comparing the image data input to the first buffer with the image data transmitted via the selector in a bit-by-bit manner over the region selected by the region control unit. In this case, the arithmetic processing of the cyclic redundancy check is not required.

[10] In article [9], the bit comparison operation unit can be equipped with a delay circuit (161, 162) for delaying the image data input to the first buffer. If the output data of the delay circuit matches the image data transmitted via the selector, it is determined that no error exists.

[11] Another display control apparatus (1) according to a representative embodiment of the present invention includes a display output control unit (100) for performing display control of image data on a display unit, a CPU (10) which can control the operation of the display output control unit, a first buffer (111) for externally outputting the image data output from the display output control unit, and a second buffer (112) for receiving the image data externally output via the first buffer into the display control apparatus again. The display output control unit includes a comparison control unit (116) which performs a cyclic redundancy check over an arbitrary region of the image displayed on the display unit, a loop-back comparison control unit (118) which performs error detection over an arbitrary region of the image data displayed on the display unit, and a selector (117) which transmits the output of the first buffer and the output of the second buffer selectively to the loop-back comparison control unit. The comparison control unit includes a first region control unit (125) which selects a region of the image data based on comparison region information for specifying an arbitrary region of the image data displayed on the display unit as a cyclic redundancy check target region, an arithmetic processing unit (122) which performs arithmetic processing for the cyclic redundancy check over a region selected by the first region control unit, and a comparison circuit (123) which performs error detection by comparing the result of the arithmetic processing by the arithmetic processing unit with its expected value. The loop-back comparison control unit includes a second region control unit (155) which selects a region of the image data based on comparison region information for specifying an arbitrary region of the image displayed on the display unit as a region to be checked, and a bit comparison processing unit (151) which performs error detection by comparing the image data input to the first buffer with the image data transmitted via the selector in a bit-by-bit manner over the region selected by the second region control unit.

2. Detailed Description of Embodiments

Embodiments will be described in detail below.

<<Embodiment 1>>

Figure 2:
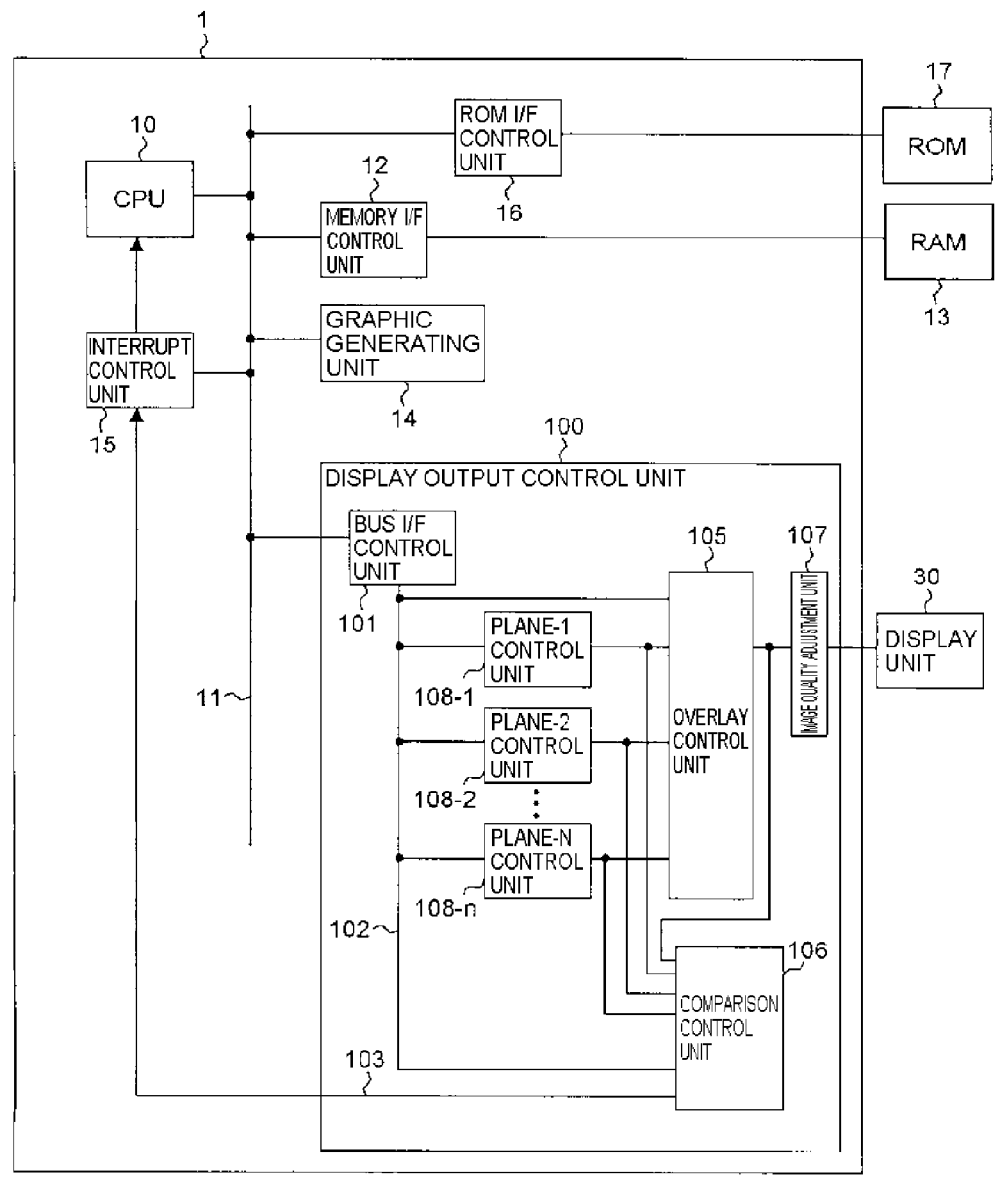
FIG. 2 is a block diagram illustrating an exemplary configuration of a display control apparatus including the comparison control unit shown in FIG. 1.

FIG. 2 illustrates an exemplary configuration of a display control apparatus according to the present invention.

Intended to perform display control of an instrument panel on a dashboard of an automobile, a display control apparatus (display control device) 1 shown in FIG. 2, including a CPU (Central Processing Unit) 10, a memory I/F control unit 12, a graphic generating unit 14, an interrupt control unit 15, a ROM I/F control unit 16, a display output control unit 100, although not particularly limited thereto, is formed on a semiconductor substrate such as a single crystal silicon substrate by well-known semiconductor integrated circuit manufacturing technology. The CPU 10, the memory I/F control unit 12, the graphic generating unit 14, the interrupt control unit 15, the ROM I/F control unit 16, and the display output control unit 100 are coupled with each other via a CPU bus 11 so that they can exchange signals. The CPU 10 controls the operation of the entire display control apparatus 1 by executing a predetermined program. The memory I/F control unit 12 performs interface control of a RAM (Random Access Memory) 13 provided outside the display control apparatus 1. The RAM 13 is used as a temporary storage region of various pieces of information or a work area for arithmetic processing by the CPU 10. The graphic generating unit 14 generates graphics to be displayed on a display unit 30 provided outside the display control apparatus 1. The display unit 30 is a liquid crystal display installed on the dashboard, although not particularly limited thereto. The interrupt control unit 15 has a function of mediating interrupt requests to the CPU 10 according to a predetermined priority. The ROM I/F control unit 16 performs interface control of a ROM 17 provided outside the display control apparatus 1. The ROM 17 has stored therein programs to be executed by the CPU 10 and various data. The display output control unit 100 performs output control of image data to the display unit 30 provided outside the display control apparatus 1.

The display output control unit 100 includes a bus I/F control unit 101, an overlay control unit (overlay processing unit) 105, a comparison control unit 106, an image quality adjustment unit 107, a plane-1 control unit 108-1, a plane-2 control unit 108-2, and a plane-n control unit 108-n (n is a positive integer). The bus I/F control unit 101, the overlay control unit 105, the comparison control unit 106, the plane-1 control unit 108-1, the plane-2 control unit 108-2 . . . and the plane-n control unit 108-n are coupled with each other via a display output control internal bus 102 so that they can exchange signals. The bus I/F control unit 101 performs interface control between the CPU bus 11 and the display output control internal bus 102. The plane-1 control unit 108-1, the plane-2 control unit 108-2, and the plane-n control unit 108-n respectively have a function of transferring the image data in the ROM 17 or the RAM 13 to the overlay control unit 105. A DMA (Direct Memory Access) controller can be applied to the plane-1 control unit 108-1, the plane-2 control unit 108-2, and the plane-n control unit 108-n, although not particularly limited thereto. The overlay control unit 105 has a function of overlaying the image data transferred by the plane-1 control unit 108-1, the plane-2 control unit 108-2, and the plane-n control unit 108-n. The image quality adjustment unit 107 adjusts the quality of the image output from the overlay control unit 105. The image data whose quality has been adjusted by the image quality adjustment unit 107 is transmitted to the display unit 30 for display. The comparison control unit 106 receives the output of the plane-2 control unit 108-2 and the plane-n control unit 108-n or the output of the overlay control unit 105, and performs a cyclic redundancy check over an arbitrary region of the image data. If an error is detected by the cyclic redundancy check, an interrupt control signal 103 is asserted to request an interrupt to the CPU 10.

FIG. 1 illustrates an exemplary configuration of the comparison control unit 106.

The comparison control unit 106 includes a selector 121, a CRC arithmetic processing unit 122, a comparison circuit 123, an interrupt control circuit 124, a region control unit 125, an operation information register 126, an overlaid image and plane selection information register 127, comparison region information registers 128, a CRC expected value information register 129, and an interrupt control information register 130.

The selector 121 transmits overlaid image information from the overlay control unit 105, plane-1 image information from the plane-1 control unit 108-i, plane-2 image information from the plane-2 control unit 108-2, and plane-n image information from the plane-n control unit 108-n selectively to the subsequent CRC arithmetic processing unit 122. The operation of the selector 121 is controlled according to the information held in the overlaid image and plane selection information register 127. The CRC arithmetic processing unit 122 performs CRC arithmetic processing of the image data transmitted via the selector 121. The CRC arithmetic processing by the CRC arithmetic processing unit 122 is performed over a region selected by the region control unit 125. The region control unit 125 performs region control on the image information based on comparison region information. With the region control on the image information, a data enable signal for the CRC arithmetic processing unit 122 is asserted by the region control unit 125 at the timing when image information corresponding to the comparison region is input to the CRC arithmetic processing unit 122. For example, the region control unit 125 includes a first counter which counts the number of scanning lines of the display frame and a second counter which counts the horizontal dot clock, determines whether or not the output of the selector 121 falls within the comparison region based on the count values of the first counter and the second counter and, if the output of the selector 121 falls within the comparison region, asserts a data enable signal. The CRC arithmetic processing unit 122 calculates the CRC of the input image data at the timing when the data enable signal is asserted. The CRC for the comparison region is obtained by such arithmetic processing. In addition, the falling edge timing of a vertical synchronizing signal 135 transmitted from the overlay control unit 105 is detected by the region control unit 125. The falling edge timing of the vertical synchronizing signal 135 is transmitted from the region control unit 125 to the comparison circuit 123 and the interrupt control circuit 124. The operation information register 126 has a value indicating whether or not to operate the comparison control unit 106 stored therein. If a value indicating an operation is stored, an enable signal to be output to the region control unit 125 is asserted. Asserting the enable signal starts operating the region control unit 125. The comparison region information is held in the comparison region information registers 128. The comparison region information held in the comparison region information registers 128 includes information for specifying the comparison region such as a start position X (131) of the comparison region, a start position Y (132) of the comparison region, a size X (133) of the comparison region, and a size Y (134) of the comparison region, for example. The comparison circuit 123 performs error detection by comparing the result of the arithmetic processing by the CRC arithmetic processing unit 122 with its expected value (also referred to as "CRC expected value"). The expected value of the result of the arithmetic processing by the CRC arithmetic processing unit 122 is held in the CRC expected value information register 129. The result of CRC computation is transmitted to the subsequent comparison circuit 123. The comparison circuit 123 performs error detection by comparing the result of the arithmetic processing by the CRC arithmetic processing unit 122 with its expected value in synchronization with the falling edge timing of the vertical synchronizing signal 135. The expected value of the result of the arithmetic processing by the CRC arithmetic processing unit 122 is held in the CRC expected value information register 129. If the result of the arithmetic processing by the CRC arithmetic processing unit 122 and its expected value do not match, an error signal is asserted from the comparison circuit 123 to the interrupt control circuit 124. If the error signal is asserted by the comparison circuit 123, the interrupt control circuit 124 asserts an interrupt control signal provided that an interrupt request to the CPU 10 is permitted by interrupt control information. The CPU 10 reads and writes information from and to the operation information register 126, the overlaid image and plane selection information register 127, the comparison region information registers 128, the CRC expected value information register 129, and the interrupt control information register 130 via register read and write control information.

Figure 5:
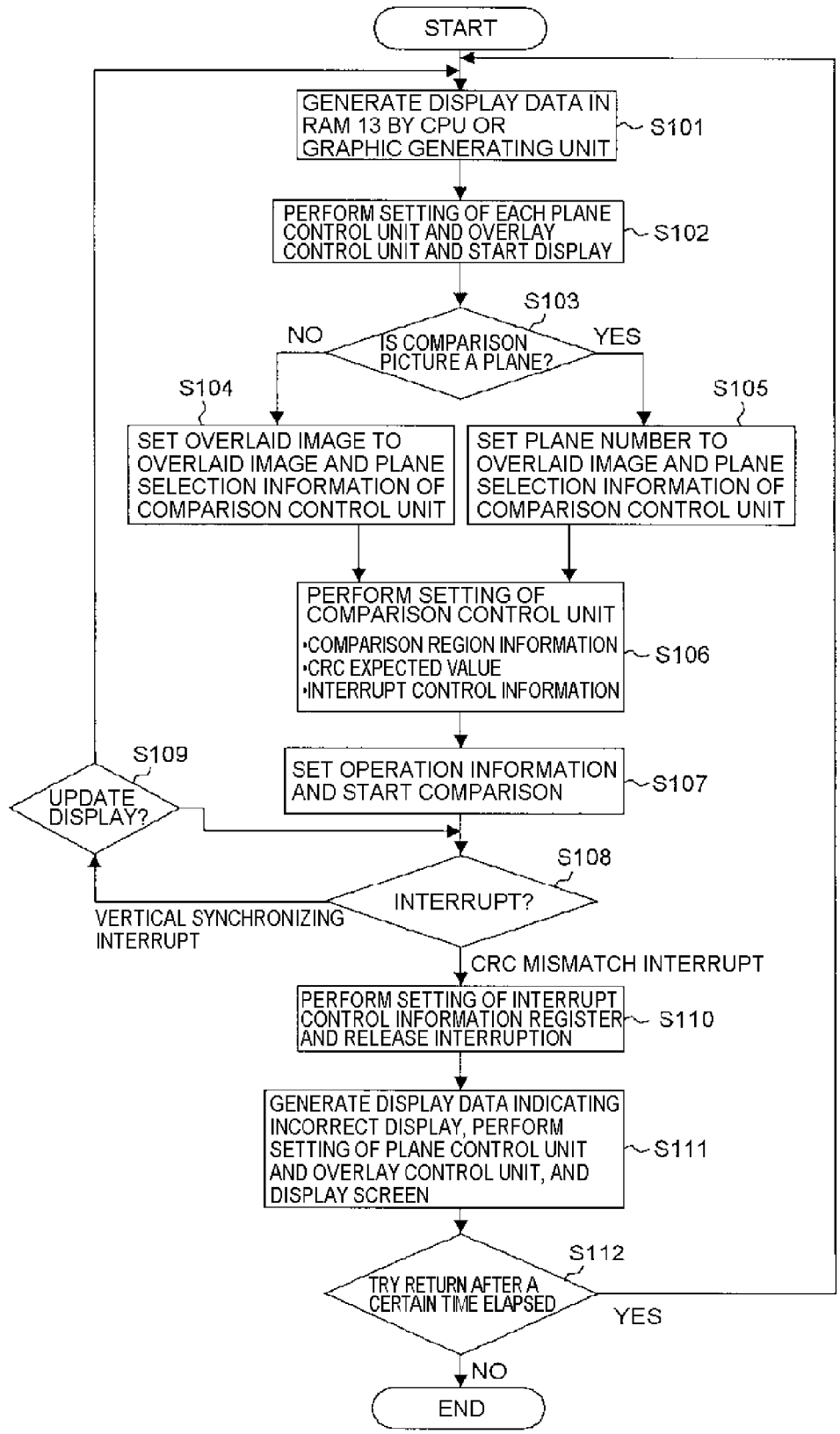
FIG. 5 is a flow chart of the main operation of the display control apparatus shown in FIG. 2.

FIG. 5 illustrates the flow of the main operation of the display control apparatus 1.

Images in the comparison region differ according to the combination of planes. Therefore, CRC expected values for images corresponding to the comparison region are preliminarily calculated and stored in the ROM 17 as a table or the like in association with the image to be compared. An image to be displayed on the display unit 30 is recognized by the CPU 10. When the image data to be displayed is read from the ROM 17 and transmitted to the image output control unit 100, the CRC expected value for the image corresponding to the comparison region is read from the table in the ROM 17 and written in the CRC expected value information register 129.

Assuming that output images of the overlay control unit 105, i.e., all the images to be displayed on the display unit 30 are targets of the CRC arithmetic processing, the amount of data of the CRC expected values becomes enormous because CRC expected values for the combination of all variations of the planes-1, 2, 3, and 4 must be prepared beforehand. As a result, memory capacity of the ROM 17 for storing such data becomes undesirably tight, which is unrealistic. Therefore it is desirable to select the planes-1, 2, 3, and 4 as CRC target regions. It is assumed that such selection information (CRC target region selection information) is also preliminarily stored in the ROM 17.

Figure 3:
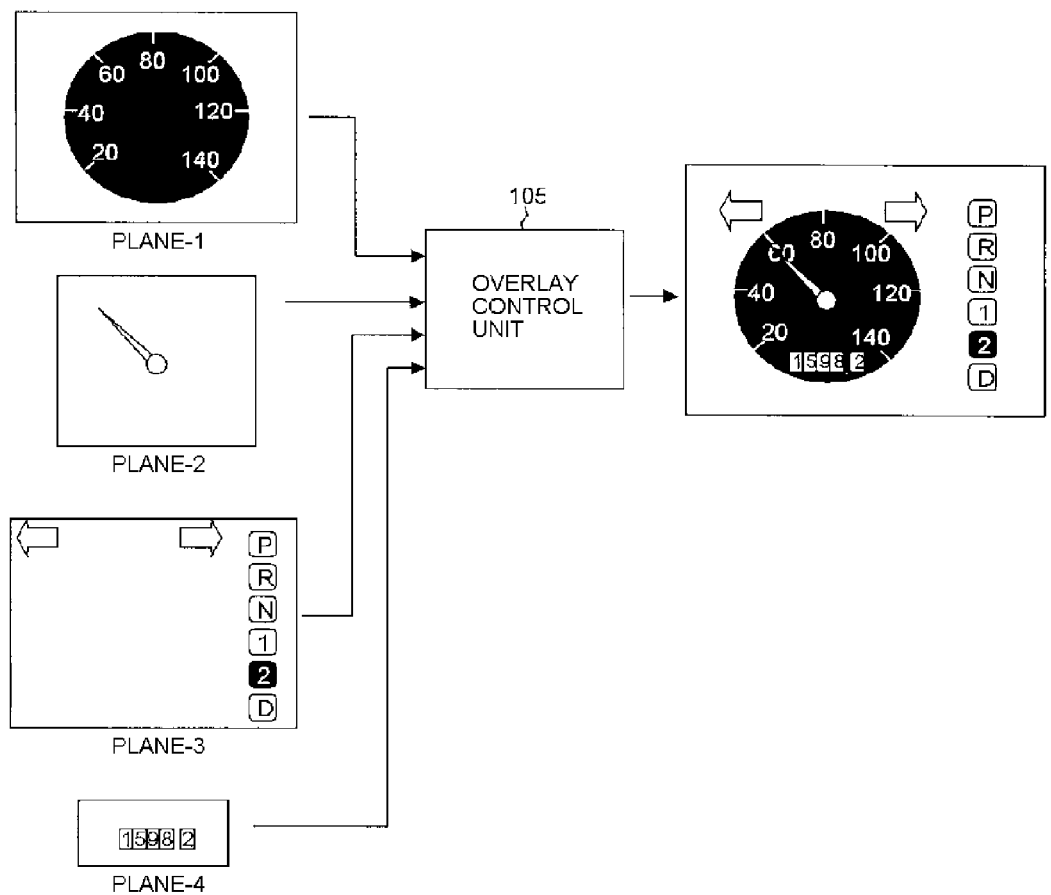
FIG. 3 is an explanatory diagram illustrating an exemplary image display by the display control apparatus shown in FIG. 2.

Display data is generated in the RAM 13 (S101) by the CPU 10 or the graphic generating unit 14. The CPU 10 then sets various pieces of information for the plane-1 control unit 108-1, the plane-2 control unit 108-2, the plane-n control unit 108-n, and the overlay control unit 105, thereby starting display of an image on the display unit 30 (S102). Displaying an image on the display unit 30 is performed as shown in FIG. 3, for example. In this image display example, it is assumed that the plane-1 is the dial face of a speedometer, the plane-2 is the needle of the speedometer, the plane 3 is the state of the blinker monitor and the automatic-transmission, and the plane 4 is the odometer, which are overlaid by overlay control unit 105.

Referring to the CRC target region selection information in the ROM 17 (S103), the CPU 10 determines whether or not the comparison image is a plane. If it is determined that the comparison image is a plane (YES), the CPU 10 sets a corresponding plane number in the overlaid image and plane selection information register 127 of the comparison control unit 106 (S105). If, on the other hand, it is determined that the comparison image is not a plane (NO), the CPU 10 sets information for selecting an overlaid image in the overlaid image and plane selection information register 127 of the comparison control unit 106 (S104). Furthermore, the CPU 10 performs setting of the comparison control unit 106 according to setting information in the ROM 17 (S106). For example, comparison region information is set in the comparison region information register 128, and a CRC expected value corresponding to the comparison region is obtained by referring to the table in the ROM 17, which is set in the CRC expected value information register 129. In addition, interrupt control information is set in the interrupt control information register 130. Subsequently, the CPU 10 sets operation information (enable signal of the region control unit 125) to the operation information register 126 (S107). Setting the operation information starts comparison control in the comparison control unit 106. In other words, information selected by the selector 121 based on the overlaid image and plane selection information is transmitted to the CRC arithmetic processing unit 122, and the CRC arithmetic processing is performed over the comparison region selected based on the comparison region information. The comparison circuit 123 compares the result of the CRC arithmetic processing with the expected value in the CRC expected value information register 129. If the result of the CRC arithmetic processing and its expected value do not match in the comparison by the comparison circuit 123, an interrupt control signal is asserted by the interrupt control circuit 124 for submitting a CRC mismatch interrupt request to the CPU 10.

The CPU 10 determines whether or not an interrupt occurred (S108). By asserting an interrupt control signal by the interrupt control circuit 124, a CRC mismatch interrupt request is submitted and a corresponding interrupt process is performed by the CPU 10. The interrupt process performs information setting of the interrupt control information register 130 to release the interrupt (S110), generates display data of an error message indicating that the display is not correct, and displays the display data on the display unit 30 via the overlay control unit 105 (S111). The driver can be informed by the display that the content displayed on the display unit 30 is not correct. After a certain time has elapsed, the CPU 10 tries return (S112) and, if returned, the process flow returns to step S101. If not returned, the display state at step Sill is continued.

If, in the determination of step S108, an interrupt occurs by a vertical synchronizing signal of the display unit 30, the CPU 10 determines whether or not the displayed image on the display unit 30 must be updated due to change of vehicle speed or mileage, for example (S109). If it is determined that the displayed image on the display unit 30 must be updated, a process (S101) for updating the displayed content on the display unit 30 is performed and the setting of the comparison control unit 106 is updated by returning to step S101.

From the viewpoint of checking malfunction in the display control apparatus 1, it is preferred here to perform the cyclic redundancy check using the data at the output stage of the display control apparatus 1. Therefore, the comparison region may be set on a part of the overlaid image as shown in FIG. 4 (A), for example. However, if the background of the plane-1 can be changed by the user using an option, the number of CRC expected value increases corresponding to the change of the background of the plane-1 with the comparison region setting for the overlaid image such as that shown in FIG. 4 (A). In order to reduce the number of CRC expected values, it is desirable to set the comparison region for the plane as shown in FIG. 4 (B), for example, rather than setting the comparison region for the overlaid image as shown in FIG. 4 (A). In the example shown in FIG. 4 (B), the comparison region is set for the plane 3, which does not influence the number of CRC expected values even if the background of the plane-1 can be changed by the user using an option because the plane-1 is not included therein.

As thus described in this example, the setting information of the comparison region which is the target of the CRC arithmetic processing, and the CRC expected value information corresponding to the comparison region are preliminarily stored in the ROM 13. According to the comparison region information in the ROM 13, the CRC arithmetic processing is performed over the comparison region set in the comparison region information register 128 and, because the computation result is compared with the CRC expected values, it suffices to prepare as large a data capacity for the CRC expected values in the ROM 13 as the number of states of the comparison region which is the target of the CRC computation. Accordingly, the amount of data of the CRC expected values in the ROM 13 is significantly reduced compared with the case where the entire displayed image on the display unit 30 is the target of the CRC computation, whereby the cyclic redundancy check in the display control apparatus 1 can be easily implemented. Therefore, it becomes possible to appropriately check whether or not the data display is normal on the graphic display instrument panel.

Although it is assumed in the above example that the expected value (CRC expected value) of the arithmetic processing by the CRC arithmetic processing unit 122 has been preliminarily calculated and stored in the ROM 17, there may be provided a CRC expected value generation circuit and calculation of the CRC expected value by the CRC expected value generation circuit can be added as a process at step S101 in FIG. 5. The CRC expected value may be calculated by the CPU 10. In that case, however, it becomes difficult to check whether or not the calculated CRC expected value is correct and thus it is preferred to check whether or not the CRC expected value generation circuit normally operates using a test image which provides the CRC, and whether or not a same CRC expected value is obtained by performing the CRC calculated value generation several times.

<<Embodiment 2>>

Figure 6:
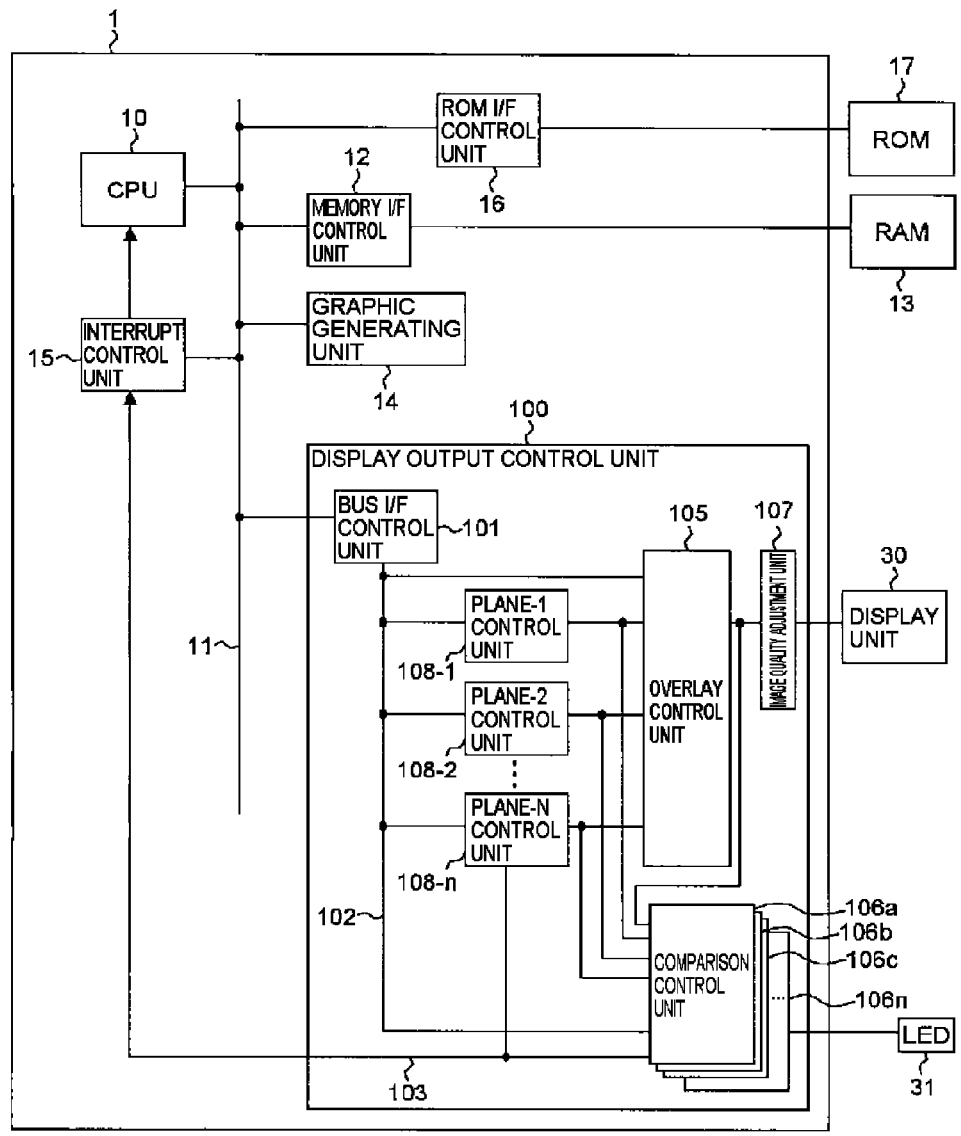
FIG. 6 is a block diagram illustrating another exemplary configuration of the display control apparatus shown in FIG. 2.

FIG. 6 illustrates another exemplary configuration of the display control apparatus 1.

The display control apparatus 1 shown in FIG. 6 substantially differs from that shown in FIG. 2 in that the cyclic redundancy check can be performed over a plurality of regions simultaneously because a plurality of comparison control units denoted by reference numerals 106a to 106n is provided, and that an LED (Light Emitting Diode) 31 is provided as a warning light. Additionally, in this example, if a CRC error is detected in any of the comparison control units 106a to 106n, the plane-n control unit 108-n is supposed to transmit a preliminarily set image of the error message to the overlay control unit 105. The LED 31 is provided nearby the display unit 30 as shown in FIG. 7, although not particularly limited thereto.

Because the comparison control units 106a to 106n are provided in this example, the comparison control unit 106a may perform CRC error detection for the plane-1, the comparison control unit 106b may perform. CRC error detection for the plane-2, the comparison control unit 106c may perform CRC error detection for the plane 3, and the comparison control unit 106n may perform CRC error detection for the plane-n. Therefore, the cyclic redundancy check can be performed simultaneously over a plurality of regions.

Figure 7:
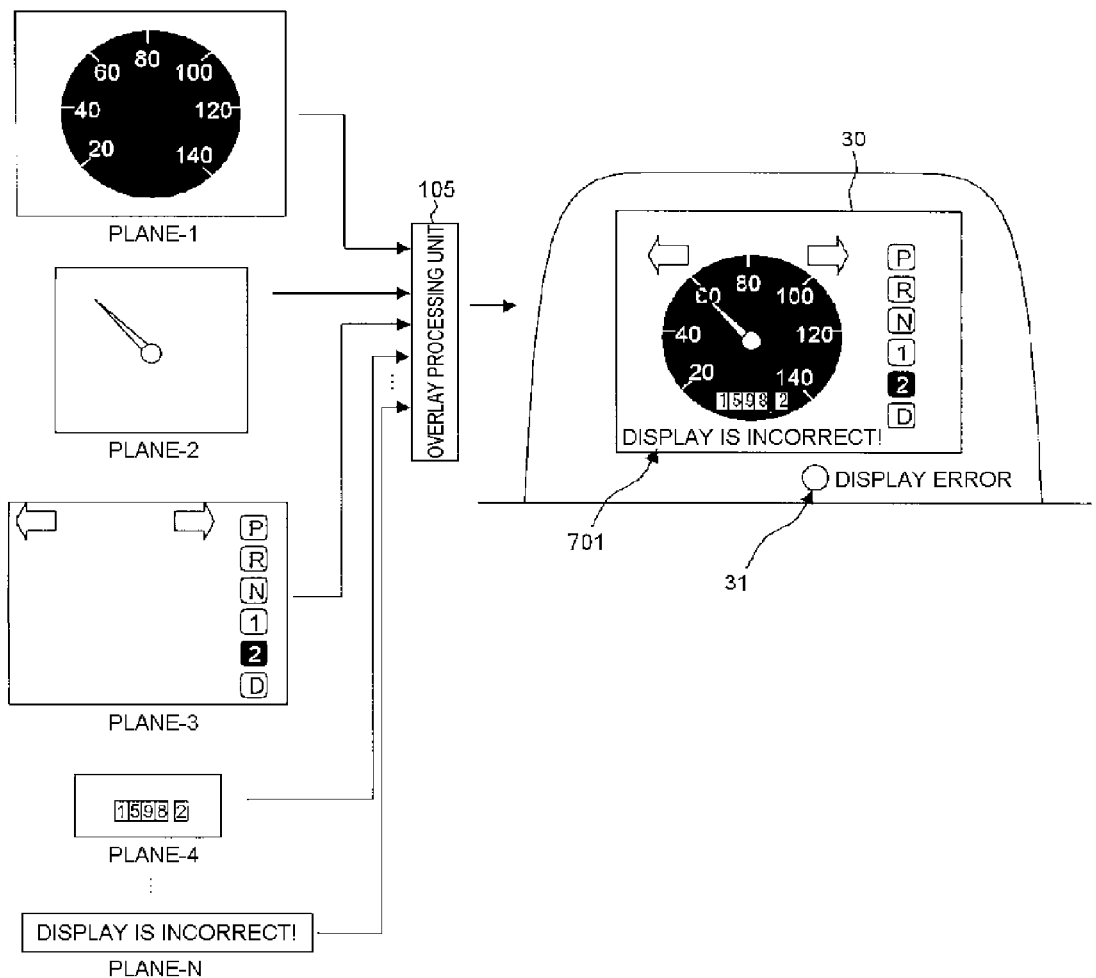
FIG. 7 is an explanatory diagram of display control by the display control apparatus shown in FIG. 6.

In addition, if a CRC error is detected in any of the comparison control units 106a to 106n and an interrupt control signal is asserted, the plane-n control unit 108-n transmits a preliminarily set image of the error message to the overlay control unit 105 so that an error message 701 such as "display is not correct!" is overlaid on the background of the plane-1 as shown in FIG. 7, for example.

Furthermore, if a CRC error is detected in any of the comparison control units 106a to 106n and an interrupt control signal is asserted, the LED 31 lights up so that the user can appropriately recognize that the current display on the display unit 30 is not correct. Even if the error message 701 is not displayed on the display unit 30 due to some error, for example, the LED 31 lights up to notify the user that the current display on the display unit 30 is not correct.

<<Embodiment 3>>

Figure 8:
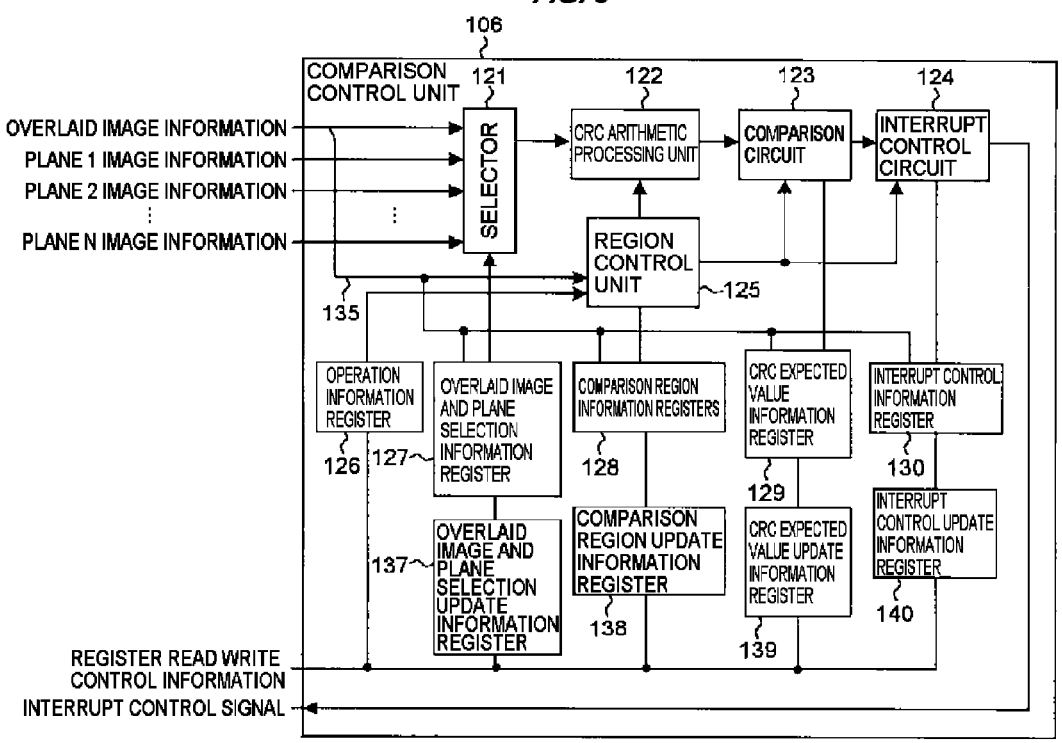
FIG. 8 is a block diagram illustrating another exemplary configuration of the comparison control unit included in the display control apparatus shown in FIG. 6.

FIG. 8 illustrates another exemplary configuration of the comparison control unit 106.

The comparison control unit 106 shown in FIG. 8 substantially differs from that shown in FIG. 1 in that various information registers are duplexed. In other words, an overlaid image and plane selection update information register 137, a comparison region update information register 138, a CRC expected value update information register 139, and an interrupt control update information register 140 are provided, respectively corresponding to the overlaid image and plane selection information register 127, the comparison region information registers 128, the CRC expected value information register 129, and the interrupt control information register 130. The duplexed various information registers read and write information according to register read write control information from the CPU 10.

Figure 9:
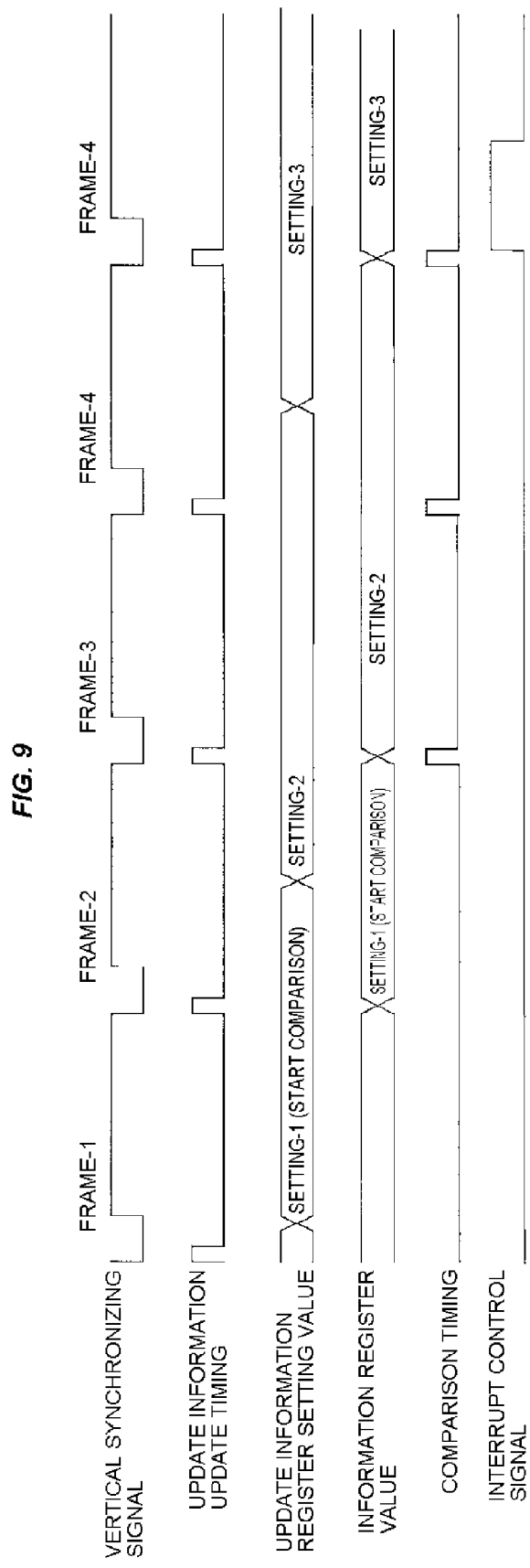
FIG. 9 is an operation timing chart of the main part of the configuration shown in FIG. 8.

FIG. 9 illustrates an operation timing chart of the main part of the configuration shown in FIG. 8.

In FIG. 9, the update information register refers to the overlaid image and plane selection update information register 137, the comparison region update information register 138, the CRC expected value update information register 139, and the interrupt control update information register 140, respectively. In addition, the information register refers to the overlaid image and plane selection information register 127, the comparison region information register 128, the CRC expected value information register 129, and the interrupt control information register 130, respectively. In this example, update information in the overlaid image and plane selection information register 127, the comparison region information register 128, the CRC expected value information register 129, and the interrupt control information register 130 is held in the corresponding overlaid image and plane selection update information register 137, the comparison region update information register 138, the CRC expected value update information register 139, and the interrupt control update information register 140. The information held in the overlaid image and plane selection update information register 137, the comparison region update information register 138, the CRC expected value update information register 139, and the interrupt control update information register 140 is then transferred, in synchronization with the vertical synchronizing signal of the display unit 30, respectively to the corresponding information registers, i.e., the overlaid image and plane selection information register 127, the comparison region information registers 128, the CRC expected value information register 129, and the interrupt control information register 130. Accordingly, the information held in the overlaid image and plane selection information register 127, the comparison region information registers 128, the CRC expected value information register 129, and the interrupt control information register 130 is immediately updated in synchronization with the vertical synchronizing signal of the display unit 30. Subsequently, comparison for error detection is performed at a predetermined timing according to the update information, and an interrupt control signal is asserted if an error is detected.

As thus described in this example, various information registers are duplexed so that appropriate information can be immediately set to the overlaid image and plane selection information register 127, the comparison region information registers 128, the CRC expected value information register 129, and the interrupt control information register 130 for each update of the image displayed on the display unit 30 or for each frame unit. For example, it becomes possible to perform comparison of different regions for each frame in synchronization with the vertical synchronizing signal, whereby comparison of a plurality of regions, although not simultaneously, is allowed without preparing a plurality of control units 106 as shown in FIG. 6.

<<Embodiment 4>>

Figure 10:
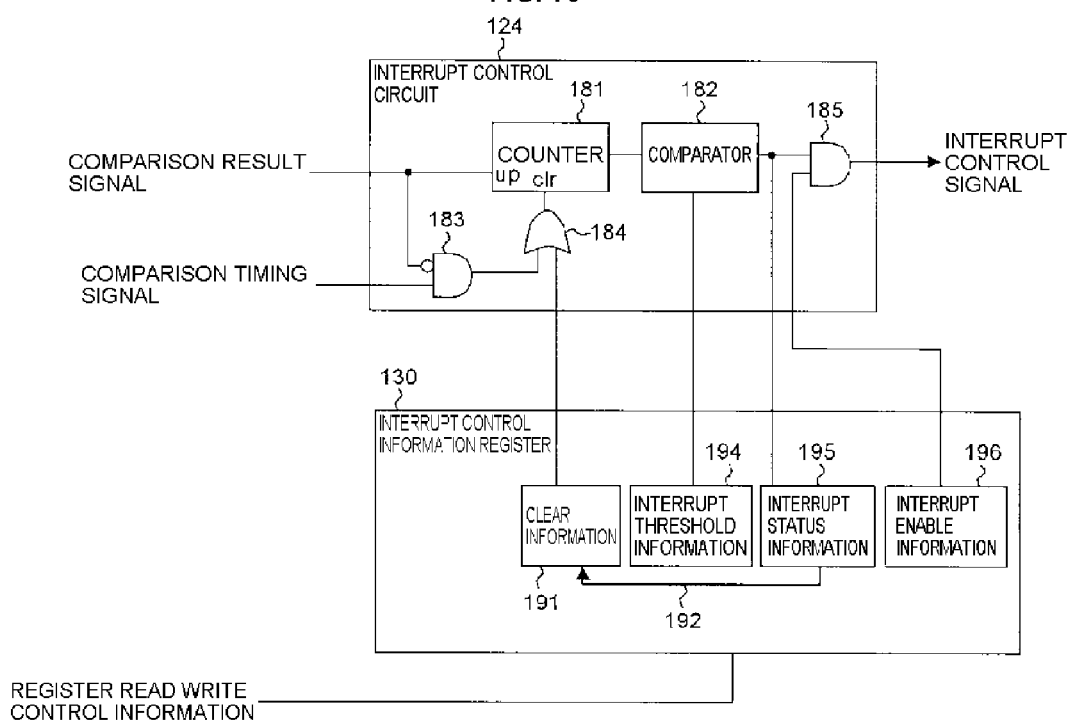
FIG. 10 is a circuit diagram illustrating an exemplary configuration of an interrupt control circuit and an interrupt control information register included in the comparison control unit shown in FIG. 1.

FIG. 10 illustrates an exemplary configuration of the interrupt control circuit 124 and the interrupt control information register 130.

The interrupt control circuit 124 includes a counter 181, a comparator 182, an AND gate 183, an OR gate 184, and an AND gate 185. If a comparison result signal from the comparison circuit 123 (see FIGS. 1 and 8) is asserted, the counter 181 counts up. The comparison result signal from the comparison circuit 123 is logically inverted and transmitted to the AND gate 183, and subsequently an AND logic operation is performed with a comparison timing signal from the region control unit 125 (see FIGS. 1 and 8), the output of the AND gate 183 is transmitted via the OR gate 184 to a clear terminal of the counter 181. Accordingly, the counter 181 is cleared if the comparison result signal from the comparison circuit 123 is negated. The comparator 182 compares the count value of the counter 181 with interrupt threshold information, which will be described below. The result of comparison is transmitted to the subsequent AND gate 185. The AND gate 185 performs an AND logic operation between the output of the comparator 182 and interrupt enable information which will be described below. The output of the AND gate is transmitted to the interrupt control unit 15 (see FIGS. 2 and 6) as an interrupt control signal.

The interrupt control information register 130 includes a clear information register 191, an interrupt threshold information register 194, an interrupt status information register 195, and an interrupt enable information register 196. The information held in the clear information register 191 is transmitted to the clear terminal of the counter 181 via the OR gate 184. The information held in the interrupt threshold information register is transmitted to the comparator 182. The information held in the interrupt status information register 195 is formed based on the output of the comparator 182. In addition, the information held in the interrupt status information register 195 is transmitted to the clear information register 191 as an interrupt status clear signal 192. The interrupt enable information register 196 holds interrupt enable information.

In the above configuration, the counter 181 counts up when a comparison result signal from the comparison circuit 123 is asserted and, if the output of the counter 181 exceeds the information held in the interrupt threshold information register 194, the output of the comparator 182 is asserted at a high level and, if the information held in the interrupt enable information register 196 is at a high level (enabled state), an interrupt control signal is asserted by the AND gate 185. If the output of the counter 181 does not exceed the information held in the interrupt threshold information register 194, the interrupt control signal is not asserted. Accordingly, in the comparison circuit 123, for example, an interrupt control signal will not be asserted based on the output of the comparator 182, because the counter 181 is cleared if an error is detected in only one frame due to external noise and subsequently no error is detected. In other words, an interrupt control signal is asserted, based on the output of the comparator 182 only when errors are successively detected for a number of times based on the interrupt threshold information. In this manner, the system can be stabilized because temporary errors due to external noise can be ignored.

<<Embodiment 5>>

Figure 11:
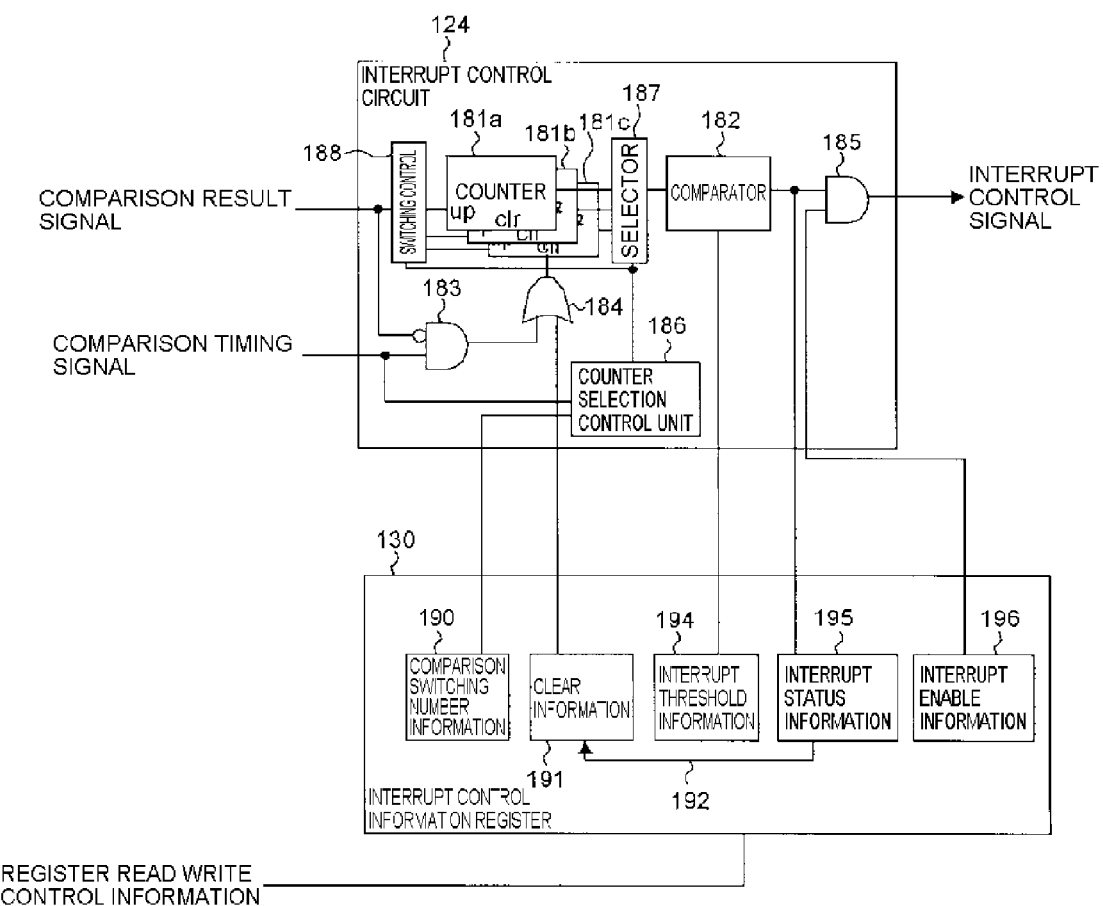
FIG. 11 is a circuit diagram illustrating another exemplary configuration of an interrupt control circuit and an interrupt control information register included in the comparison control unit shown in FIG. 1.

FIG. 11 illustrates another configuration of the interrupt control circuit 124 and interrupt control information register 130.

Figure 12:
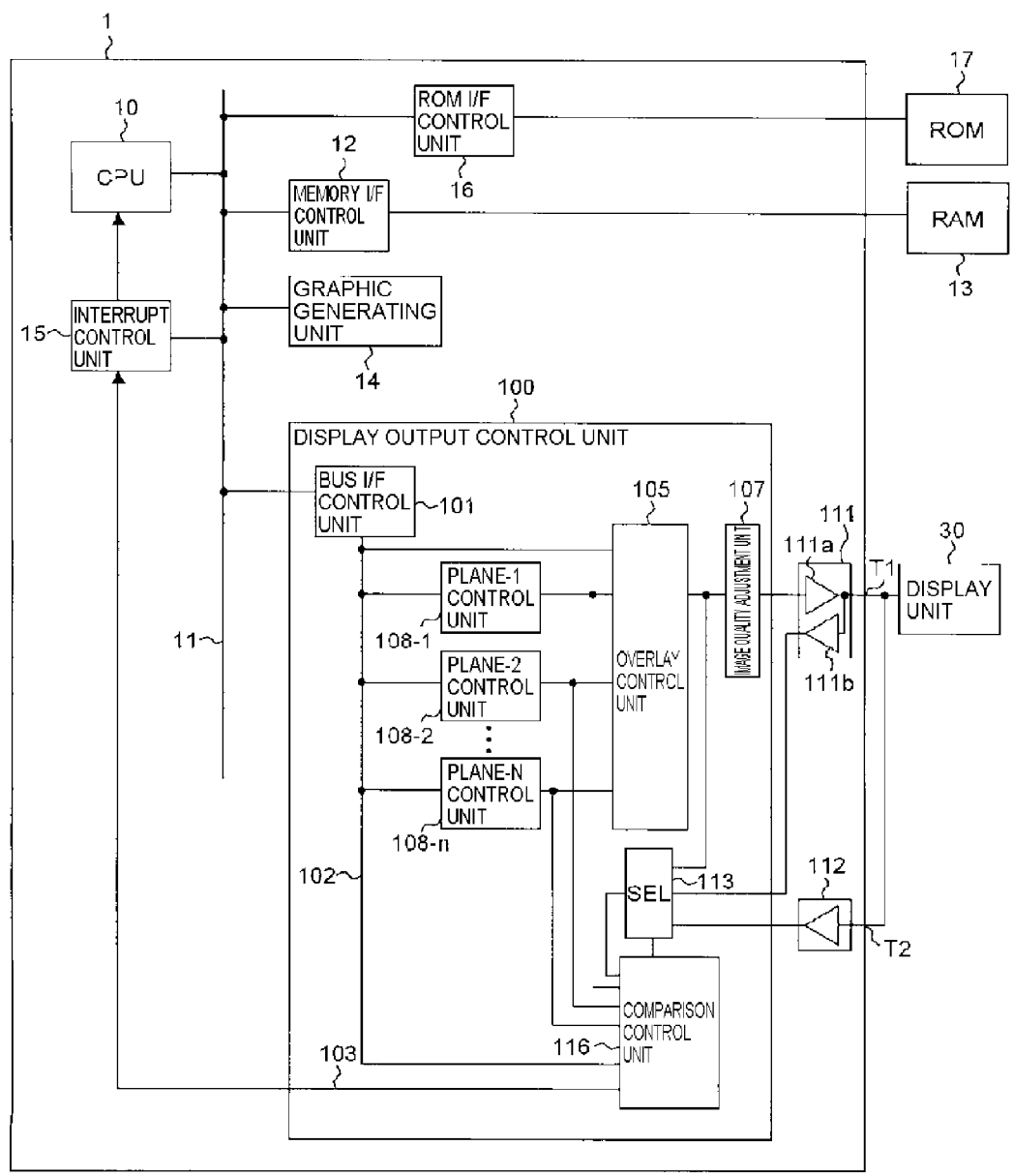
FIG. 12 is a block diagram illustrating another exemplary configuration of a display control apparatus according to the present invention.

The interrupt control circuit 124 shown in FIG. 11 substantially differs from that shown in FIG. 12 in that a plurality of counters 181a, 181b, and 181c are provided, and that a switching control circuit 188, a selector 187, and a counter selection control circuit are provided. The switching control circuit 188 distributes the comparison result signal from the comparison circuit 123 to the counters 181a, 181b, and 181c. The selector 187 transmits the output of the counters 181a, 181b, and 181c selectively to the comparison circuit 182. The counter selection control unit 186 controls the operation of the switching control circuit 188 and the selector 187 based on the comparison timing signal and comparison switching number information, which will be described below.

The interrupt control information register 130 shown in FIG. 11 substantially differs from that shown in FIG. 12 in that a comparison switching number information register 190 which holds comparison switching number information is provided. The information held in the comparison switching number information register 190 is transmitted to the counter selection control unit 186 in the interrupt control circuit 124. If the comparison switching number information is "1", for example, the counter 181a is selected by control of the counter selection control unit 186 in synchronization with the comparison timing signal. If the comparison switching number information is "2", the counters 181a and 181b are selected by control of the counter selection control unit 186 in synchronization with the comparison timing signal. If the comparison switching number information is "3", the counters 181a, 181b, and 181c are selected by control of the counter selection control unit 186 in synchronization with the comparison timing signal. According to the above configuration, the counters 181a, 181b, and 181c can be used in a switching manner in synchronization with the comparison timing signal, which is effective when it is desired to switch comparison regions for each frame.

<<Embodiment 6>>

FIG. 12 illustrates another exemplary configuration of the display control apparatus 1.

The display control apparatus 1 shown in FIG. 12 substantially differs from that shown in FIG. 2 in that a selector (SEL) 113 is provided so that the selector 113 can select the data to be received in the comparison control unit 116. The comparison control unit 116 has the same function as that of the comparison control unit 106 shown in FIG. 2. In this example, the output of the image quality adjustment unit 107 is input to the display unit 30 via an output buffer unit 111a in an input and output buffer 111 and an external terminal T1. In addition, the output of the output buffer unit 111a in the input and output buffer 111 is input to the selector 113 via an input buffer unit 111b in the input and output buffer 111. Furthermore, the output of the output buffer unit 111a in the input and output buffer 111 is input to the selector 113 via external terminals T1 and T2, and an input buffer 112. The selector 113 selectively transmits the input data to the comparison control unit 116. The selecting operation by the selector 113 can be controlled by the comparison control unit 116. If the output of the input buffer unit 111b in the input and output buffer 111 is selected by the selector 113 and also selected by the comparison control unit 116, the cyclic redundancy check is performed including the overlay control unit 105 and the input and output buffer 111. If, the output of the input buffer 112 is selected by the selector 113 and also selected by the comparison control unit 116, the cyclic redundancy check is performed including the overlay control unit 105, the input and output buffer 111, the external terminals T1 and T2, and the input buffer 112, whereby an error due to poor contact with a connector used for coupling an external terminal and the display unit can also be detected. In such a configuration, however, images are compared with regard to the signals that performed the processing in the image quality adjustment unit 107, and allowing various image quality adjustment in the image quality adjustment unit 107 may result in an enormous number of CRC expected values, and thus it becomes necessary to suppress the number of CRC expected values to be stored by choosing to or not to perform dithering, or limiting the levels of hue adjustment to three, for example.

<<Embodiment 7>>

Figure 13:
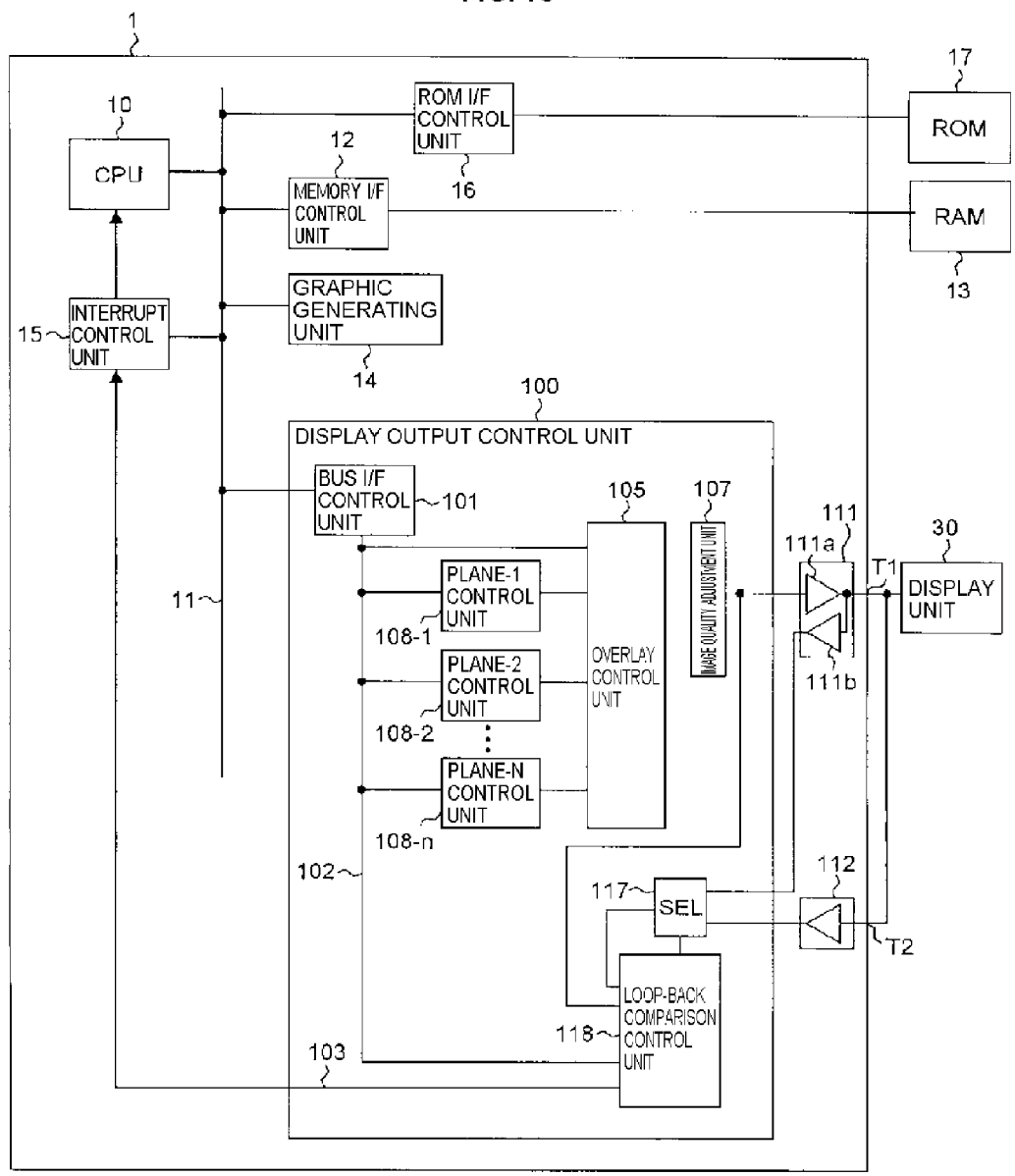
FIG. 13 is a block diagram illustrating another exemplary configuration of a display control apparatus according to the present invention.

FIG. 13 illustrates another exemplary configuration of the display control apparatus 1.

The display control apparatus 1 shown in FIG. 13 substantially differs from that shown in FIG. 12 in that the loop-back comparison control unit 118 is provided in place of the comparison control unit 116. The loop-back comparison control unit 118 performs error detection over an arbitrary region of the image displayed on the display unit 30. The result of error detection is transmitted to the interrupt control unit 15 as the interrupt control signal 103.

Figure 14:
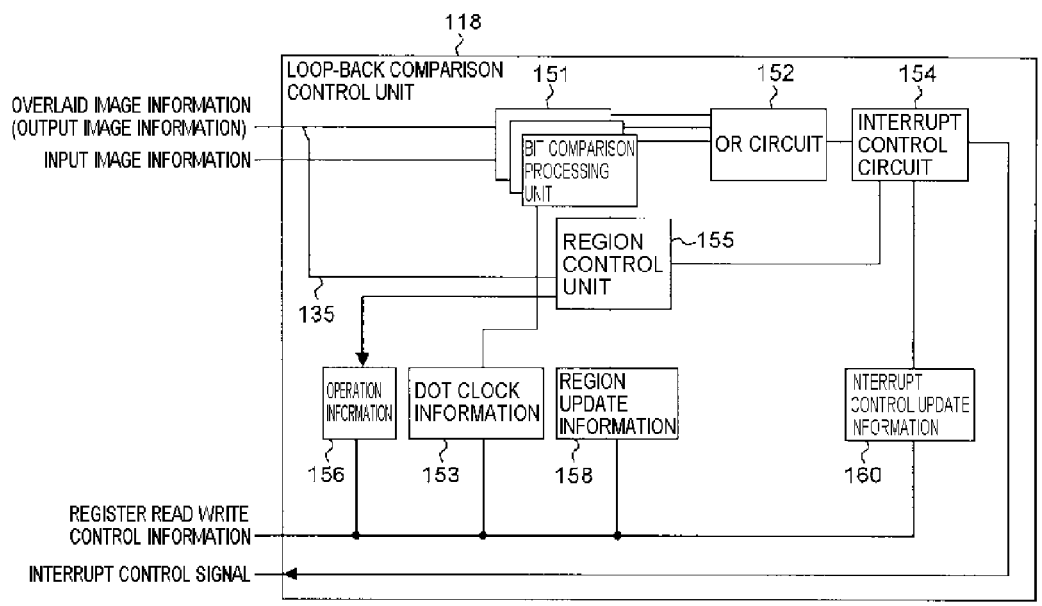
FIG. 14 is a block diagram illustrating an exemplary configuration of a loop-back comparison control unit included in the display control apparatus shown in FIG. 3.

FIG. 14 illustrates an exemplary configuration of the loop-back comparison control unit 118.

The loop-back comparison control unit 118 includes a bit comparison operation unit 151, an OR circuit 152, an interrupt control circuit 154, a region control unit 155, an operation information register 156, a dot clock information register 153, a region update information register 158, and an interrupt control update information register 160.

The region control unit 155 controls the comparison region according to the region update information held in the region update information register 158. The bit comparison operation unit 151 compares the image information (overlaid image information) input to the output buffer 111a in the input and output buffer 111 with the input image information received via the selector 117, in a bit-by-bit manner over the region selected by the region control unit 155. Timing adjustment of the comparison is performed according to the information held in the dot clock information register 153. In addition, if there are a plurality of comparison regions, a plurality of the bit comparison operation units 151 are provided to perform bit comparison over the comparison regions by the bit comparison processing units 151. The OR circuit 152 performs an OR logic operation of output signals from the bit comparison operations units 151. The output of the OR circuit 152 is transmitted to the subsequent interrupt control circuit 154. As with the interrupt control circuit 124 in FIG. 1, the interrupt control circuit 154 asserts an interrupt control signal when an error occurs. Whether or not to assert an interrupt control signal by the interrupt control circuit 154 is determined according to the information held in the interrupt control update information register 160. The operation information register 156 holds an enable signal of the region control unit 155. Asserting the enable signal causes the operation of the region control unit 155 to be started.

Figure 15:
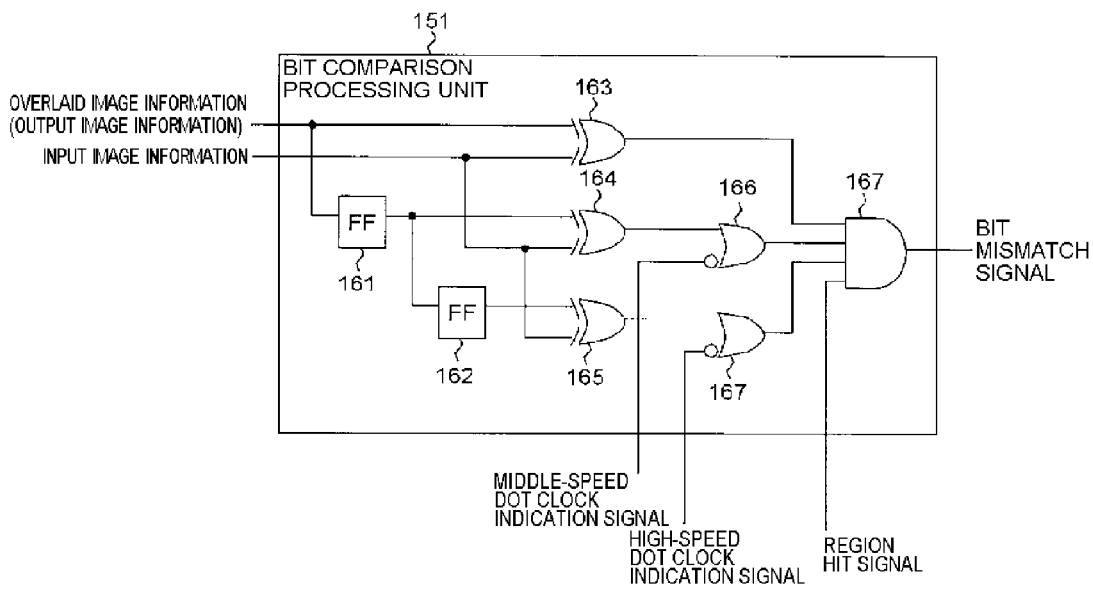
FIG. 15 is a circuit diagram illustrating an exemplary configuration of the main part of the loop-back comparison control unit shown in FIG. 14.

FIG. 15 illustrates an exemplary configuration of the bit comparison operation unit 151.

The bit comparison operation unit 151 includes flip-flop circuits (FF) 161 and 162, exclusive OR (exclusive logic sum) gates 163, 164, and 165, OR gates 166 and 167, and an AND gate 168. The overlaid image information is transmitted to the exclusive OR gate 163, then transmitted to the exclusive OR gate 164 with a delay of one clock in the flip-flop circuit 161, and further transmitted to the exclusive OR gate 165 with a delay of two clocks in the flip-flop circuits 161 and 162. The exclusive OR gates 163, 164, and 165 determine whether or not the logic of two information respectively input thereto matches. The OR gate 166 performs an OR logic operation of a logically inverted middle-speed dot clock indication signal and an output of the exclusive OR gate 164. The OR gate 167 performs an OR logic operation of a logically inverted high-speed dot clock indication signal and an output of the exclusive OR gate 165. The AND gate 168 performs an AND logic operation of an output of exclusive OR gate 163, an output of the OR gate 166, an output of OR gate 167, and a region hit signal from the region control unit 155. The output of the AND gate 168 is transmitted to the OR circuit 152 as a bit mismatch signal. The middle-speed dot clock indication signal and the high-speed dot clock indication signal are included in the dot clock information held in the dot clock information register 153.

In this example, mode selection is performed according to the middle-speed dot clock indication signal and the high-speed dot clock indication signal. In the high-speed mode, raising both the middle-speed dot clock indication signal and the high-speed dot clock indication signal to a high-level prevents the output of the exclusive OR gates 164, and 165 from being transmitted to the AND gate 168. In the middle-speed mode, raising the middle-speed dot clock indication signal to a high-level and dropping the high-speed dot clock indication signal to a low level prevent the output of exclusive OR gate 164 from being transmitted to the AND gate 168. In the low speed mode, dropping both the middle-speed dot clock indication signal and the high-speed dot clock indication signal to a low level causes both outputs of the exclusive OR gates 164 and 165 to be transmitted to the AND gate 168. If there is at least one match in the logic operations of the exclusive OR gates 163, 164, and 165, it is determined that no error exists and no bit mismatch signal is asserted. If there is no match, the AND gate 168 asserts a bit mismatch signal. The AND gate 168 has a region hit signal from the region control unit 155 input thereto, and a bit mismatch signal is asserted provided that the region hit signal is at a high-level. The logic value of the region hit signal is determined according to the information held in the region update information register 158. Accordingly, error detection is performed over an arbitrary comparison region.

Figure 16:
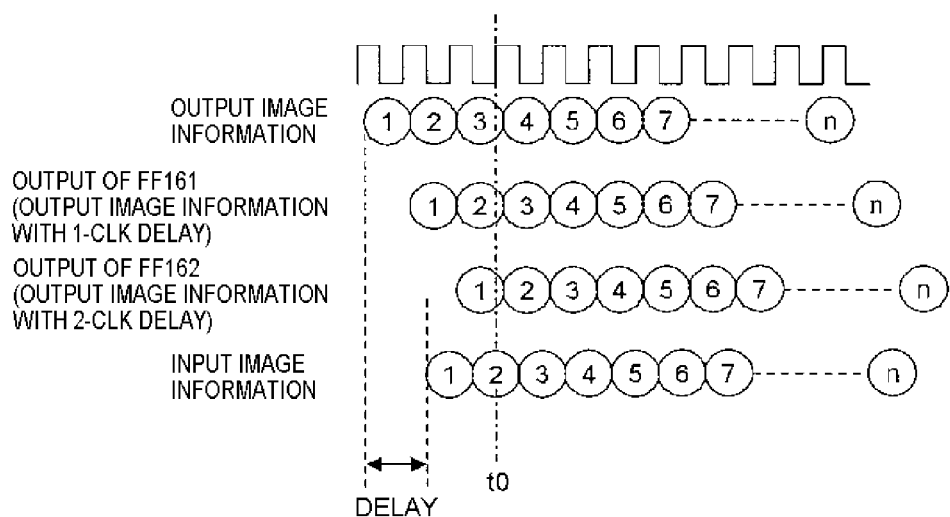
FIG. 16 is an operation timing chart of the configuration shown in FIG. 15.

FIG. 16 illustrates an operation timing of the configuration shown in FIG. 15.

In this example, if a delay within a range smaller than three clocks is anticipated at time t0, for example, it is determined that no error exists if the input image received via the selector 117 matches any of the dots 1, 2, and 3 (indicated by circles). Such a configuration can cope with a case, although restricted, where comparison cannot be performed in the same clock because a looped-back signal passing through the I/O buffer makes the delay larger. In other words, it becomes possible to perform complete comparison in the low speed mode and, although complete comparison is not possible in the middle- and high-speed mode, a design can be realized which allows comparison of images to be compared because the image to be compared is already known and detectable pixels can be preliminarily calculated.

<<Embodiment 8>>

Figure 17:
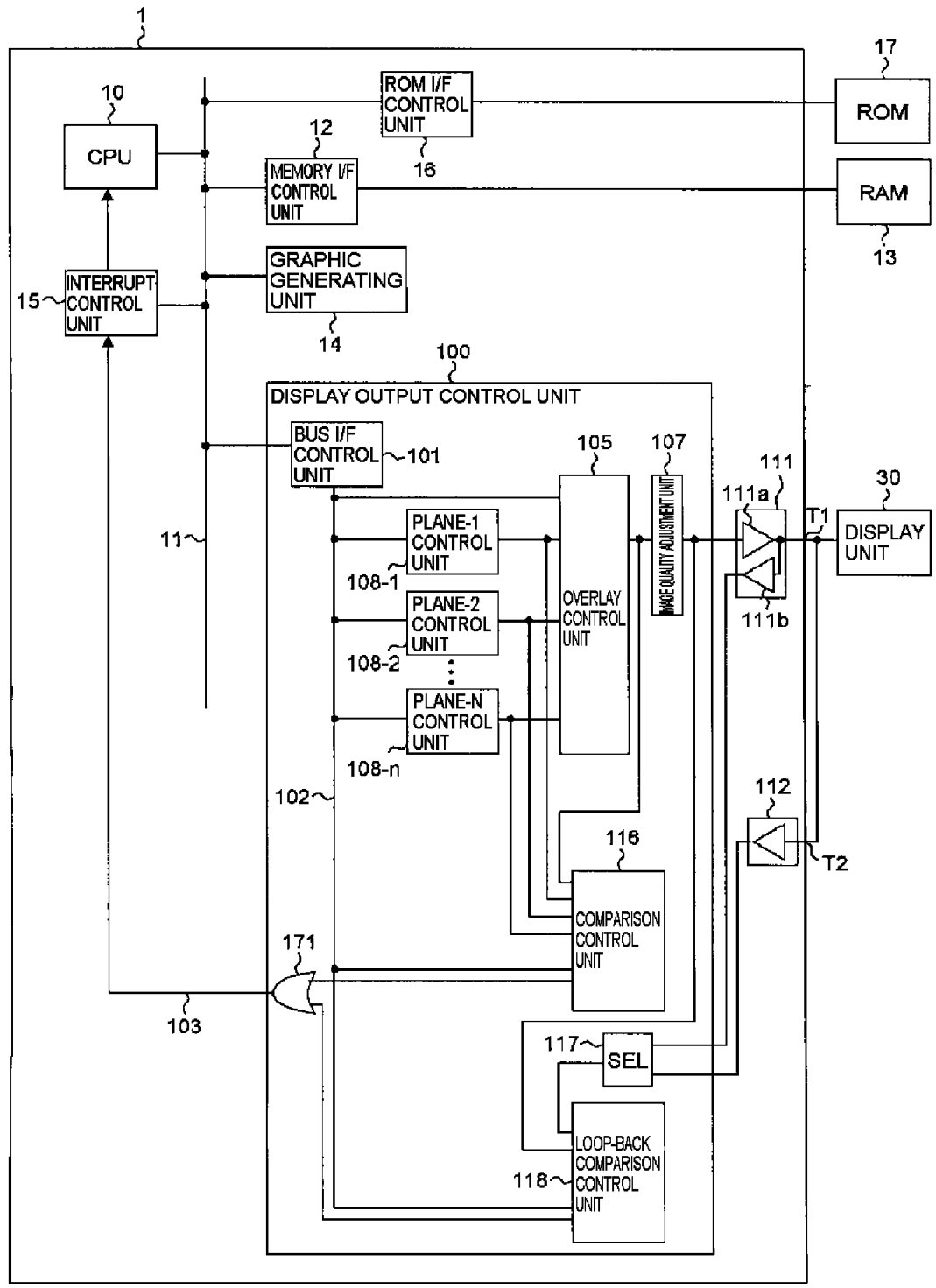
FIG. 17 is a block diagram illustrating an exemplary configuration of a display control apparatus according to the present invention.

FIG. 17 illustrates an exemplary configuration of the loop-back comparison control unit 118.

The loop-back comparison control unit 118 shown in FIG. 17 is a combination of the main configuration of FIG. 12 and the main configuration of FIG. 13. In other words, the loop-back comparison control unit 118 shown in FIG. 17 includes the comparison control unit 116 having the same function as that shown in FIG. 12, and the loop-back comparison control unit 118 having the same function as that shown in FIG. 13. The interrupt control signal output from the comparison control unit 116 and the interrupt control signal output from the loop-back comparison control unit 118 are transmitted to the interrupt control unit 15 via the OR gate 171. In this example, error detection in the loop-back comparison control unit 118 is performed in addition to the error detection in the comparison control unit 116.

Although the invention made by the inventors has been specifically described above based on its embodiments, it is needless to say that the invention can be modified in various ways without deviating from its scope.

What is claimed is:

1. A display control apparatus comprising:
   a display output control unit for performing display control of image data on a display unit, and
   a CPU which can control operation of the display output control unit,
   wherein
   the display output control unit includes a comparison control unit which performs a cyclic redundancy check over an arbitrary region of the image data displayed on the display unit, and
   the comparison control unit includes a region control unit which selects a region of the image data based on comparison region information for specifying an arbitrary region of the image displayed on the display unit as a cyclic redundancy check target region, an arithmetic processing unit which performs arithmetic processing for a cyclic redundancy check over a region selected by the region control unit, and a comparison circuit which performs error detection by comparing the result of the arithmetic processing by the arithmetic processing unit with an expected value.

2. The display control apparatus according to claim 1, wherein the display output control unit further includes a plurality of plane control units for receiving different image data respectively, and an overlay control unit which forms image data to be displayed by overlaying the image data received by the plane control unit, and
wherein the comparison control unit further includes a selector which can supply output image information of the plane control unit or output image information of the overlay control unit selectively to the arithmetic processing unit.

3. The display control apparatus according to claim 2, wherein a plurality of the comparison control units is provided, the comparison control units performing, in parallel, the cyclic redundancy check over an arbitrary region of the image data respectively displayed on the display unit.

4. The display control apparatus according to claim 2, wherein the comparison control unit displays an error message on the display unit based on the result of the comparison by the comparison circuit, and turns on a warning light provided near the display unit.

5. The display control apparatus according to claim 2, further comprising:
a selection information register which holds control information of the selector;
a selection update information register which holds update information of the control information in the selection information register;
a comparison region information register which holds the comparison region information;
a comparison region update information register which holds update information of the comparison region information in the comparison region information register;
an expected value information register which holds an expected value of the results of the arithmetic processing by the arithmetic processing unit; and
an expected value update information register which holds update information of the expected value in the expected value information register,
wherein the information held in the selection information register is updated by the information held in the selection update information register in synchronization with a vertical synchronizing signal of the display unit,
wherein the information held in the comparison region information register is updated by the information held in the comparison region update information register in synchronization with the vertical synchronizing signal of the display unit, and
wherein the information held in the expected value information register is updated by the information held in the expected value update information register in synchronization with the vertical synchronizing signal of the display unit.

6. The display control apparatus according to claim 2, wherein the comparison control unit includes an interrupt control circuit which forms an interrupt control signal for requesting an interrupt to the CPU based on the result of the comparison by the comparison circuit,
wherein the interrupt control circuit includes a counter for counting the number of erroneous frames based on the result of the comparison by the comparison circuit, and a comparator for comparing the value counted by the counter with a predetermined threshold, and
wherein the interrupt control signal is asserted, based on the result of the comparison by the comparator.

7. The display control apparatus according to claim 2, wherein the comparison control unit includes an interrupt control circuit which forms an interrupt control signal for requesting an interrupt to the CPU based on the result of the comparison by the comparison circuit, and
wherein the interrupt control circuit includes a plurality of counters for counting the number of erroneous frames based on the result of the comparison by the comparison circuit, a counter selection control unit for selecting the counters, and a comparator for comparing the value counted by the counter selected by the counter selection control unit with a predetermined threshold, and
wherein the interrupt control signal is asserted, based on the result of the comparison by the comparator.

8. The display control apparatus according to claim 2, further comprising
a first buffer for externally outputting the image data output from the display output control unit; and
a second buffer for receiving the image data externally output via the first buffer into the display control apparatus again,
wherein the display output control unit includes a selector for transmitting the output of the first buffer and the output of the second buffer selectively to the comparison control unit.

9. A display control apparatus comprising:
a display output control unit for performing display control of image data on a display unit;
a CPU which can control the operation of the display output control unit;
a first buffer for externally outputting the image data output from the display output control unit; and
a second buffer for receiving the image data externally output via the first buffer into the display control apparatus again,
wherein the display output control unit includes a loop-back comparison control unit which performs error detection over an arbitrary region of the image displayed on the display unit, and a selector which transmits the output of the first buffer and the output of the second buffer selectively to the loop-back comparison control unit, and
wherein the loop-back comparison control unit includes a region control unit which selects a region of the image data based on region update information for specifying an arbitrary region of the image displayed on the display unit as a region to be checked, and a bit comparison processing unit which performs error detection by comparing the image data input to the first buffer with the image data transmitted via the selector in a bit-by-bit manner over the region selected by the region control unit.

10. The display control apparatus according to claim 9, wherein the bit comparison processing unit includes a delay circuit for delaying the image data input to the first buffer, and it is determined that no error exists if the output data of the delay circuit matches the image data transmitted via the selector.

11. A display control device comprising:
a display output control unit for performing display control of image data on a display unit;
a CPU which can control the operation of the display output control unit;

a first buffer for externally outputting the image data output from the display output control unit; and
a second buffer for receiving the image data externally output via the first buffer into the display control apparatus again,
wherein the display output control unit includes a comparison control unit which performs a cyclic redundancy check over an arbitrary region of the image displayed on the display unit, and a loop-back comparison control unit which performs error detection over an arbitrary region of the image data displayed on the display unit,
wherein the comparison control unit includes a first region control unit which selects a region of the image data based on comparison region information for specifying an arbitrary region of the image data displayed on the display unit as a cyclic redundancy check target region, an arithmetic processing unit which performs arithmetic processing for the cyclic redundancy check over a region selected by the first region control unit, and a comparison circuit which performs error detection by comparing the result of the arithmetic processing by the arithmetic processing unit with its expected value, and
wherein the loop-back comparison control unit includes a second region control unit which selects a region of the image data based on comparison region information for specifying an arbitrary region of the image displayed on the display unit as a region to be checked, a selector for transmitting the output of the first buffer and the output of the second buffer selectively to the loop-back comparison control unit, and a bit comparison processing unit which performs error detection by comparing the image data input to the first buffer with the image data transmitted via the selector in a bit-by-bit manner over the region selected by the second region control unit.

12. A display control apparatus comprising:
a region control unit which selects a cyclic redundancy check target region based on comparison region information for specifying an arbitrary region of the first image data,
an arithmetic processing unit which performs a predetermine arithmetic processing for a cyclic redundancy check over the cyclic redundancy check target region,
a comparison circuit which performs error detection by comparing the result of the predetermined arithmetic processing with a predetermined value, and
wherein the display control apparatus outputs second image data based on first image data to a display unit.

13. A display control apparatus according to claim 12, further comprising:
a CPU which can control the operation of the outputting of the second image data,
an interrupt control circuit which forms an interrupt control signal for requesting an interrupt to the CPU based on the result of the comparison by the comparison circuit,
wherein the interrupt control circuit includes a counter for counting the number of erroneous frames based on the result of the comparison by the comparison circuit, and a comparator for comparing the value counted by the counter with a predetermined threshold, and
wherein the interrupt control signal is asserted, based on the result of the comparison by the comparator.

14. A display control apparatus according to claim 12, further comprising:
a CPU which can control the operation of the outputting of the second image data,
an interrupt control circuit which forms an interrupt control signal for requesting an interrupt to the CPU based on the result of the comparison by the comparison circuit, and
wherein the interrupt control circuit includes a plurality of counters for counting the number of erroneous frames based on the result of the comparison by the comparison circuit, a counter selection control unit for selecting the counters, and a comparator for comparing the value counted by the counter selected by the counter selection control unit with a predetermined threshold, and
wherein the interrupt control signal is asserted, based on the result of the comparison by the comparator.

15. A display control apparatus according to claim 12, further comprising:
a plurality of plane control units for receiving different image data respectively, and an overlay control unit which forms image data to be displayed by overlaying the image data received by the plane control unit, and
a selector which can supply output image information of the plane control unit or output image information of the overlay control unit selectively to the arithmetic processing unit.

16. A display control apparatus according to claim 15, further comprising:
a selection information register which holds control information of the selector;
a selection update information register which holds update information of the control information in the selection information register;
a comparison region information register which holds the comparison region information;
a comparison region update information register which holds update information of the comparison region information in the comparison region information register;
an expected value information register which holds an expected value of the results of the arithmetic processing by the arithmetic processing unit; and
an expected value update information register which holds update information of the expected value in the expected value information register,
wherein the information held in the selection information register is updated by the information held in the selection update information register in synchronization with a vertical synchronizing signal of the display unit,
wherein the information held in the comparison region information register is updated by the information held in the comparison region update information register in synchronization with the vertical synchronizing signal of the display unit, and
wherein the information held in the expected value information register is updated by the information held in the expected value update information register in synchronization with the vertical synchronizing signal of the display unit.

17. A display control apparatus according to claim 15, wherein an error message is displayed on the display unit based on the result of the comparison by the comparison circuit.

* * * * *